(12) United States Patent
Kuroyanagi et al.

(10) Patent No.: US 9,805,961 B2
(45) Date of Patent: Oct. 31, 2017

(54) TRANSFER SYSTEM

(71) Applicants: DENSO CORPORATION, Kariya, Aichi-pref. (JP); MURATA MACHINERY, LTD., Minami-ku, Kyoto-shi, Kyoto (JP)

(72) Inventors: Masaaki Kuroyanagi, Anjo (JP); Toshihiro Okumura, Nukata-gun (JP); Keisuke Yoshida, Nishio (JP); Kenji Ota, Ise (JP)

(73) Assignees: DENSO CORPORATION, Kariya (JP); MURATA MACHINERY, LTD., Kyoto (JP)

( * ) Notice: Subject to any disclaimer, the term of this patent is extended or adjusted under 35 U.S.C. 154(b) by 150 days.

(21) Appl. No.: 14/852,802

(22) Filed: Sep. 14, 2015

(65) Prior Publication Data
US 2016/0079103 A1 Mar. 17, 2016

(30) Foreign Application Priority Data

Sep. 16, 2014 (JP) .................................. 2014-187798

(51) Int. Cl.
*H01L 21/67* (2006.01)
*H01L 21/677* (2006.01)
*G05B 19/418* (2006.01)

(52) U.S. Cl.
CPC .... *H01L 21/67276* (2013.01); *G05B 19/4189* (2013.01); *H01L 21/6773* (2013.01); *G05B 2219/31002* (2013.01); *G05B 2219/31014* (2013.01); *G05B 2219/45031* (2013.01); *Y02P 90/08* (2015.11); *Y02P 90/28* (2015.11); *Y02P 90/285* (2015.11)

(58) Field of Classification Search
CPC ..................... H01L 21/67276; H01L 21/6773
See application file for complete search history.

(56) References Cited

U.S. PATENT DOCUMENTS

| | | | | |
|---|---|---|---|---|
| 6,979,168 B2* | 12/2005 | Uchimaki | ......... | H01L 21/67276 414/217.1 |
| 7,457,680 B2* | 11/2008 | Akiyama | .......... | H01L 21/67276 414/935 |
| 7,899,568 B2* | 3/2011 | Yamamoto | ........ | H01L 21/67225 414/935 |
| 9,177,844 B2* | 11/2015 | Kuroyanagi | ...... | H01L 21/67715 |

(Continued)

FOREIGN PATENT DOCUMENTS

| JP | 11-334810 A | 12/1999 |
|---|---|---|
| JP | 2000-203702 A | 7/2000 |
| JP | 2004-221227 A | 8/2004 |

*Primary Examiner* — James Keenan
(74) *Attorney, Agent, or Firm* — Posz Law Group, PLC

(57) ABSTRACT

In a transfer system, at least one of a plurality of process apparatuses is connected to a station as a connected process apparatus. A station control unit controls a transfer device provided in the station through a communication with a process apparatus control unit to load the processing object to the connected process apparatus from the station and to unload the processing object from the connected process apparatus to the station. The station control unit controls the transfer device to begin unloading of the processing object from the connected process apparatus to the station after receiving a signal indicative of a presence of the processing object to be unloaded from the process apparatus control unit.

5 Claims, 6 Drawing Sheets

(56) References Cited

U.S. PATENT DOCUMENTS

2009/0292388 A1* 11/2009 Iimori .............. G05B 19/41865
　　　　　　　　　　　　　　　　　　　　700/112
2014/0147235 A1　　5/2014 Kuroyanagi et al.
2014/0297017 A1* 10/2014 Mizutani ............ G05B 19/4189
　　　　　　　　　　　　　　　　　　　　700/112

* cited by examiner

TRANSFER SYSTEM

CROSS REFERENCE TO RELATED APPLICATION

This application is based on Japanese Patent Application No. 2014-187798 filed on Sep. 16, 2014, the disclosure of which is incorporated herein by reference.

TECHNICAL FIELD

The present disclosure relates to a transfer system that transfers a processing object in a production factory.

BACKGROUND

It has been known a transfer system used in production factories of semiconductor devices. The transfer system includes a plurality of process apparatuses (equipment). Objects to be processed (hereinafter referred to as processing objects), such as semiconductor wafers, are sequentially transferred to respective process apparatuses to be processed in the respective process apparatuses. Such a transfer system is, for example, disclosed in JP 2004-221277 A.

The transfer system includes, in addition to the process apparatuses, stations in which the processing objects are stored before being processed by the process apparatuses, and carriers that transfer the processing objects between the stations and the process apparatuses. The processing objects are transferred from the station to the process apparatus to be processed. After being processed in the process apparatus, the processing objects are transferred to the station to be stored. Thereafter, the processing objects are transferred to another process apparatus to be processed.

SUMMARY

Such a transfer system generally includes a plurality of transfer vehicles. However, the processing objects are sequentially transferred to the process apparatuses. Therefore, there is a case where the processing objects are not transferred even if the process apparatus is available, that is, in a standby state. In such a case, a rate of operation will reduce.

It is an object of the present disclosure to provide a transfer system that is capable of restricting the reduction of a rate of operation.

According to an aspect of the present disclosure, a transfer system includes a plurality of process apparatuses, a process apparatus control unit, a station, a transfer device, and a station control unit. Each of process apparatuses conducts a predetermined process to a processing object to be processed. The process apparatus control unit controls the process apparatuses. The station stores the processing object. The transfer device is provided in the station and transfers the processing object. The station control unit controls the transfer device. At least one of the plurality of process apparatuses is connected to the station as a connected process apparatus. The station control unit controls the transfer device through a communication with the process apparatus control unit to load the processing object to the connected process apparatus from the station and to unload the processing object from the connected process apparatus to the station. The station control unit controls the transfer device to begin unloading of the processing object from the connected process apparatus to the station after receiving a signal indicative of a presence of the processing object to be unloaded from the process apparatus control unit.

In the above transfer system, a carrier is not necessary to transfer the processing object between the station and the connected process apparatus. Therefore, the decrease of the rate of operation can be restricted. The station control unit controls the transfer device to unload the processing object from the connected process apparatus to the station on condition that the process apparatus control unit outputs the signal indicative of the presence of the processing object to be unloaded. Therefore, the connected process apparatus can be provided without largely changing the entire system.

BRIEF DESCRIPTION OF THE DRAWINGS

The above and other objects, features and advantages of the present disclosure will become more apparent from the following detailed description made with reference to the accompanying drawings, in which like parts are designated by like reference numbers and in which.

DETAILED DESCRIPTION

Embodiments of the present disclosure will be described with reference to the drawings. In the embodiments, the same or equivalent parts will be designated with the same reference numbers.

First Embodiment

A transfer system according to a first embodiment of the present disclosure will be described. The transfer system of the present embodiment is exemplarily used to transfer processing objects accommodated in cassettes in a production factory, such as a production factory of semiconductor devices.

Figure 1:
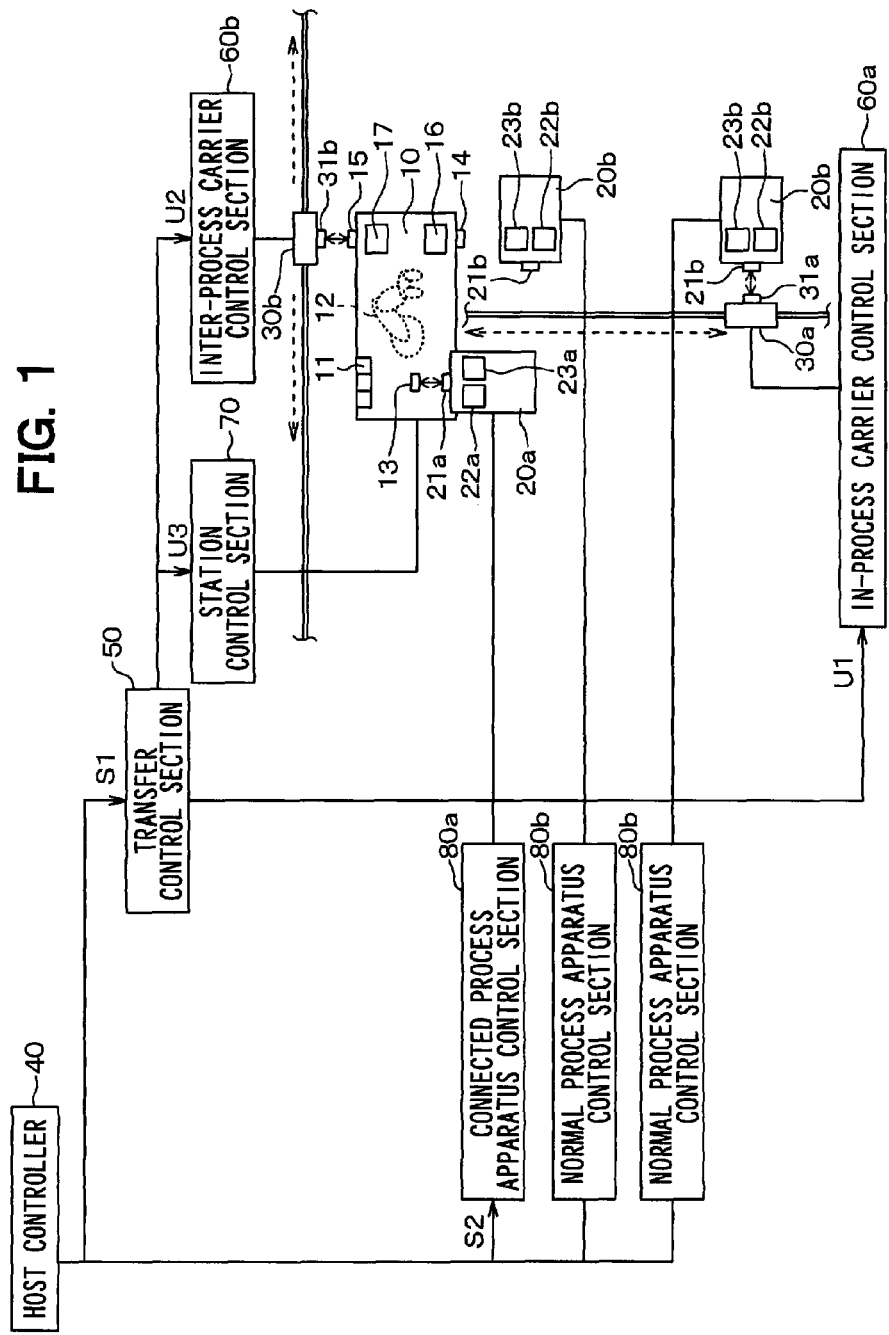
FIG. 1 is a schematic diagram of a transfer system according to a first embodiment of the present disclosure.

As shown in FIG. 1, the transfer system includes a station 10, process apparatuses 20a, 20b, carriers 30a, 30b, a host controller 40, a transfer control section 50, an in-process carrier control section 60a, an inter-process carrier control section 60b, a station control section 70, a connected process apparatus control section 80a, and a normal process apparatus control section 80b.

Figure 2:
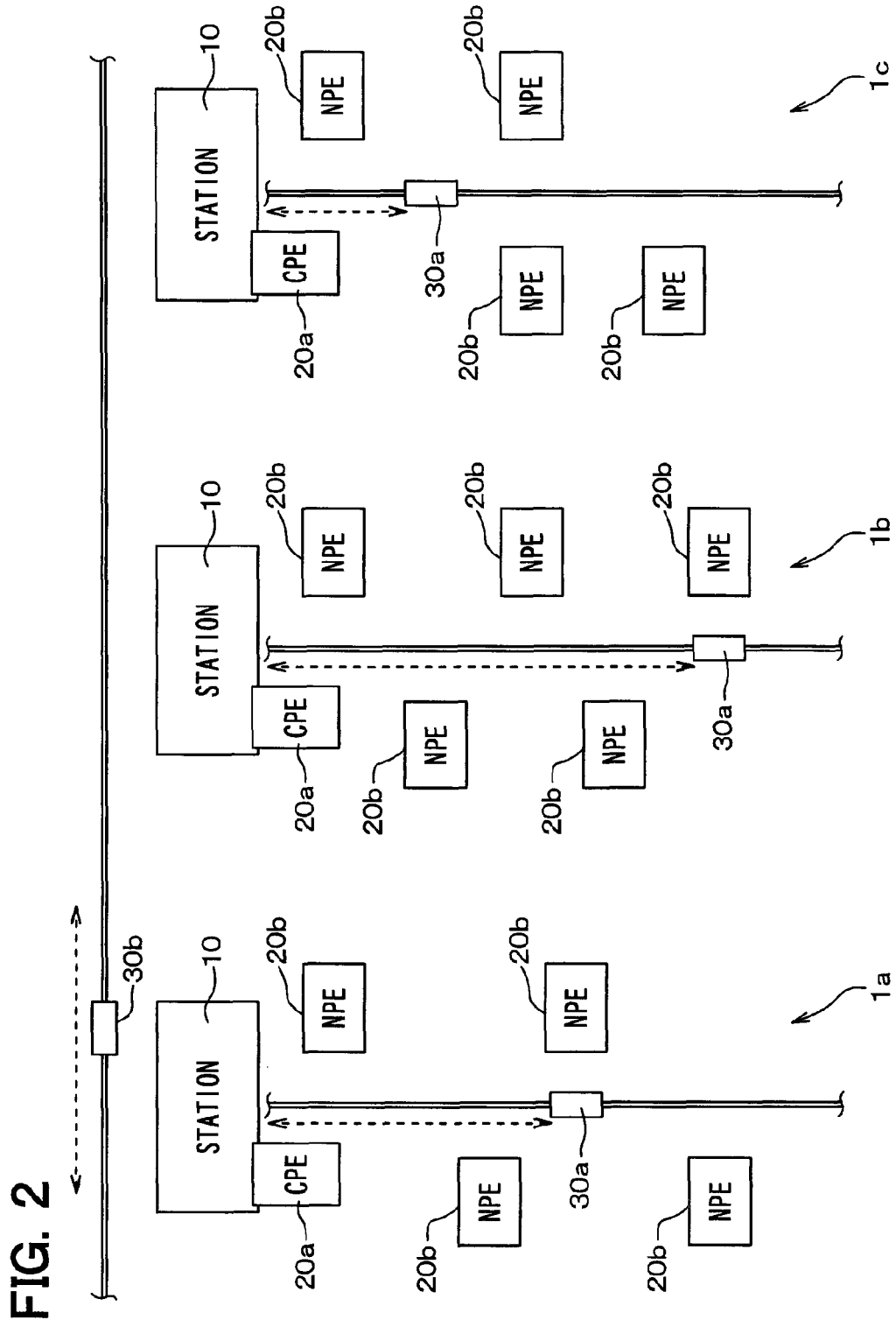
FIG. 2 is a schematic diagram illustrating a layout of stations and process apparatuses of the transfer system according to the first embodiment.

In the present embodiment, as shown in FIG. 2, one station 10 is provided for each of first to third areas (first to third production lines) 1a to 1c, which are divided in a production factory. As shown in FIG. 1, the station 10 includes a storage 11, a transfer robot 12, a first optical communication device 13, a second optical communication device 14, a third optical communication device 15, a first stage 16, and a second stage 17. The storage 11 stores cassettes accommodating the processing objects, such as semiconductor wafers. The transfer robot 12 serves as a transfer device to transfer the cassette. The first optical communication device 13 performs an optical input/output (I/O) communication with an optical communication device 21a, which will be described later. The second optical communication device 14 performs an optical input/output (I/O) communication with an optical communication device 31a, which will be described later. The third optical communication device 15 performs an optical input/output (I/O) communication with an optical communication device 31b, which will be described later.

Although the first to third areas 1a to 1c are illustrated in FIG. 2, there are further areas provided in an actual production factory. For example, the cassette for accommodating the processing object is a generally-known standard mechanical interface (SMIF) or a front opening unified pod (FOUP). The cassette includes a main body, a lid and a flange. The main body has one face with an opening covered by the lid. The flange is equipped to the main body. The main body and the lid define an accommodation space therein to accommodate the processing object, such as a semiconductor wafer. For example, when the processing object is a semiconductor wafer, one cassette accommodates several tens of semiconductor wafers.

The process apparatuses 20a and 20b are apparatuses for producing semiconductor devices, and will also be referred to as process equipment. The process apparatuses 20a and 20b are, for example, a thermal treatment apparatus, an ion implantation apparatus, an etching apparatus, a deposition apparatus, a cleaning apparatus, a photoresist applying apparatus, an exposure apparatus, an inspection apparatus and the like. As shown in FIG. 2, plural number of process apparatuses 20a 20b are provided in each of the areas 1a to 1c. The process apparatus 20a is provided with the optical communication device 21a, and the process apparatus 20b is provided with the optical communication device 21b.

As shown in FIG. 1 and FIG. 2, in each of the first to third areas 1a to 1c, the process apparatus 20a, which is one of the plural process apparatuses 20a, 20b, is connected to the corresponding station 10. That is, the process apparatus 20a is provided in the station 10. The optical communication device 21a of the process apparatus 20a can directly perform the optical I/O communication with the first optical communication device 13 provided in the station 10.

Therefore, loading of the cassette to the process apparatus 20a from the station 10 and unloading of the cassette from the process apparatus 20a to the station 10 are directly performed by the transfer robot 10 provided in the station 10. The process apparatus 20a that is connected to the station 10, that is, provided in the station 10 will be hereinafter referred to as the connected process apparatus. Also, the process apparatuses 20b that are not provided in the station 10 will be referred to as the normal process apparatuses. In FIG. 2, CPE denotes the connected process apparatus 20a, and NPE denotes the normal process apparatus 20b.

The connected process apparatus 20a is one that does not have the longest process period, among the process apparatuses 20a, 20b provided in each of the first to third areas 1a to 1c. In the present embodiment, the connected process apparatus 20a is one having the shortest process period among the process apparatuses 20a, 20b provided in the same area. For example, the connected process apparatus 20a is the inspection apparatus.

Each of the connected process apparatus 20a and the normal process apparatuses 20b has a first stage 22a, 22b and a second stage 23a, 23b on which the cassette is placed when the cassette is loaded or unloaded.

The carriers 30a, 30b transfer the cassettes, and load and unload the cassettes. The carriers 30a, 30b have transfer robots (not shown) as a transfer device. As the transfer carriers 30a, 30b, automated guided vehicle (AGV), rail guided vehicle (RGV) and the like are employed. Hereinafter, the carrier 30a that travels within each area 1a to 1c will be referred to as the in-process carrier 30a, and the carrier 30b that travels over the first to third areas 1a to 1c will be referred to as the inter-process carrier 30b (see FIG. 1 and FIG. 2). For example, the in-process carrier 30a may also be referred to as an in-area carrier 30a, and the inter-process carrier 30b may also be referred to as an inter-area carrier 30b.

The in-process carrier 30a is provided with the optical communication device 31a that performs the optical I/O communication with the second optical communication device 14 of the station 10 and the optical communication device 21b of the normal process apparatus 20b. Likewise, the inter-process carrier 30b is provided with the optical communication device 31b that performs the optical I/O communication with the third optical communication device 15 of the station 10.

Each of the host controller 40, the transfer control section 50, the in-process carrier control section 60a, the inter-process carrier control section 60b, the station control section 70, the connected process apparatus control section 80a and the normal process apparatus control section 80b includes a CPU, memories serving as storages, and peripheral devices. In the present embodiment, the station control section 70 corresponds to a station control unit, and the connected process apparatus control section 80a corresponds to a process apparatus control unit that performs communication with the station control unit.

The host controller 40 controls an entire system of the production factory. The host controller 40 is configured to be communicable with the transfer control section 50, the connected process apparatus control section 80a, and the normal process apparatus control section 80b. The host controller 40 stores the processing step of each cassette (processing objects) in the storage. The host controller 40 generates and outputs a first signal S1 and a second signal S2 indicating a previous transfer location (transfer source) and a subsequent transfer location (transfer destination) of each cassette based on the processing condition of the cassettes and the states of the process apparatuses 20a, 20b. Although not described in detail, the host controller 40 also outputs signals for driving the process apparatuses 20a, 20b.

For example, the host controller 40 provides the first signal S1 to the transfer control section 50, when the cassette is transferred between the station 10 and the normal process apparatus 20b in the same area 1a to 1c, when the cassette is transferred between the first to third areas 1a to 1c, and when the cassette is loaded to the connected process apparatus 20a from the station 10. The host controller 40 outputs the second signal S2 to the connected process apparatus control section 80a when the cassette is unloaded from the connected process apparatus 20a to the station 10.

The transfer control section 50 stores, in the storage, data indicating in which area each of the connected process apparatuses 20a, each of the normal process apparatuses 20b, and each of the stations 10 are located. When receiving the first signal S1 from the host controller 40, the transfer control section 50 acquires information on the area in which the station 10, the connected process apparatus 20a or the normal process apparatus 20b as the previous transfer location and the subsequent transfer location are located.

In a case where the first signal S1 indicates a command to transfer the cassette between the station 10 and the normal process apparatus 20b of the same one of the first to third areas 1a to 1c, the transfer control section 50 provides a first transfer command signal U1 to the in-process carrier control section 60a of the corresponding area.

In a case where the first signal S1 indicates a command to transfer the cassette from one area to another area, that is, between different areas 1a to 1c, the transfer control section 50 provides a second transfer command signal U2 to the inter-process transfer control section 60b. In a case where the first signal S1 indicates a command to load the cassette to the connected process apparatus 20a from the station 10, the transfer control section 50 provides a third transfer command signal U3 to the station control section 70.

The in-process carrier control section 60a is provided in each of the first to third areas 1a to 1c. The in-process carrier control section 60a is communicable with each of the in-process carriers 30a of the corresponding area. The in-process carrier control section 60a stores a transfer state of each of the in-process carriers 30a of the corresponding area in the storage. The transfer state indicates whether the in-process carrier 30a is a standby state, whether the in-process carrier 30a is in a transferring state, and the like. When receiving the first transfer command signal U1 from the transfer control section 50, the in-process transfer control section 60a selects the in-process carrier 30a that is in the standby state in the transferring area, and transmits a transfer command to the in-process carrier 30a selected. Thus, the in-process carrier 30a selected performs loading or unloading of the cassette between the station 10 and the normal process apparatus 20b.

The inter-process carrier control section 60b is configured to be communicable with the inter-process carrier 30b. The inter-process carrier control section 60b stores a transfer state of the inter-process carrier 30b in the storage. The transfer state of the inter-process carrier 30b indicates whether the inter-process carrier 30b is in a standby state, whether the inter-process carrier 30b is in a transferring state, and the like. When receiving the second transfer command signal U2 from the transfer control section 50, the inter-process carrier control section 60b selects the inter-process carrier 30b that is in the standby state, in the transferring area, and transmits the transfer command to the inter-process carrier 30b selected. Thus, the inter-process carrier 30b selected performs loading or unloading of the cassette between the stations 10 of the respective areas 1a to 1c.

The station control section 70 suitably performs the optical I/O communication through the first to third optical communication devices 13 to 15 to control the transfer robot 12 provided in the station 10, to thereby transfer the cassette. When receiving the third transfer command signal U3 from the transfer control section 50, the station control section 70 controls the transfer robot 12 of the station 10 to load the cassette to the connected process apparatus 20a provided in the corresponding station 10.

The connected process apparatus control section 80a is configured to be communicable with the connected process apparatus 20a. The connected process apparatus control section 80a controls the connected process apparatus 20a to perform processing under a predetermined processing condition. When the connected process apparatus 20a completes the processing, the connected process apparatus control section 80a outputs a signal indicative of the completion of the processing to the host controller 40. Then, when receiving the second signal S2 from the host controller 40, the connected process apparatus control section 80a performs the optical I/O communication with the station control section 70 through the optical communication device 21a and the first optical communication device 13 to unload the cassette from the connected process apparatus 20a to the station 10. That is, the unloading of the cassette from the connected process apparatus 20a to the station 10 is performed according to the connected process apparatus control section 80a (connected process apparatus 20a). In the present embodiment, since the connected process apparatus 20a is the inspection apparatus, an inspection result is also provided from the connected process apparatus control section 80a to the host controller 40.

The normal process apparatus control section 80b is configured to be communicable with the normal process apparatus 20b. The normal process apparatus control section 80b controls the normal process apparatus 20b to perform processing under a predetermined processing condition. The normal process apparatus control section 80b performs the optical I/O communication with the in-process carrier control section 60a through the optical communication device 21b and the optical communication device 31a to load the cassette to the normal process apparatus 20b or to unload the cassette from the normal process apparatus 20b.

Next, the optical I/O communication will be described.

In the present embodiment, the optical I/O communication between the in-process carrier 30a (in-process carrier control section 60a) and the normal process apparatus 20b (normal process apparatus control section 80b) and the station 10 (station control section 70), the optical I/O communication between the inter-process carrier 30b (inter-process carrier control section 60b) and the station 10 (station control section 70), and the optical I/O communication between the station 10 (station control section 70) and the connected process apparatus 20a (connected process apparatus control section 80a) are performed by 8-bit input/output according to Semiconductor Equipment and Materials International (SEMI) standard.

First, the optical I/O communication between the in-process carrier 30a and the normal process apparatus 20b and the station 10, and the optical I/O communication between the inter-process carrier 30b and the station 10 will be described. These optical I/O communications are performed in a similar manner to a general communication. Therefore, the optical I/O communication between the in-process carrier 30a and the normal process apparatus 20b will be described as an example.

Figure 3A:
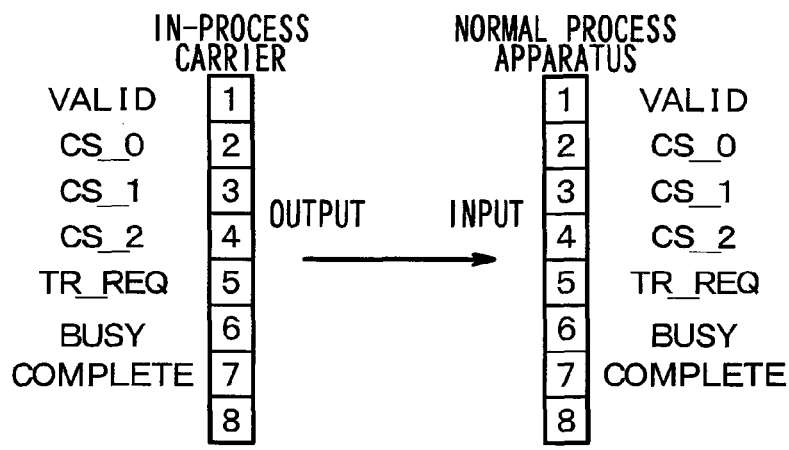
FIG. 3A is a schematic diagram illustrating a signal provided from an in-process carrier to a normal process apparatus according to the first embodiment.
Figure 3B:
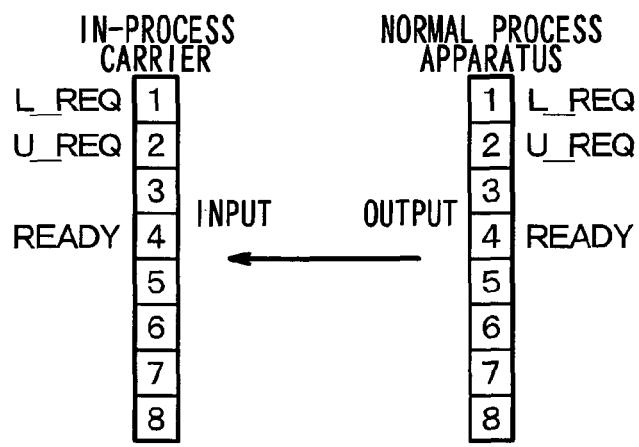
FIG. 3B is a schematic diagram illustrating a signal provided from the normal process apparatus to the in-process carrier according to the first embodiment.

As shown in FIG. 3A, the in-process carrier 30a outputs a signal storing bits indicating VALID, CS_0 to CS_2, TR_REQ, BUSY, and COMPLETE to the normal process apparatus 20b. As shown in FIG. 3B, the normal process apparatus 20b outputs a signal storing bits indicating L_REQ, U_REQ, and READY to the in-process carrier 30a.

In regard to the signal outputted from the in-process carrier 30a, VALID is for indicating whether the signal is valid or not. When the bit of VALID is 1 (high), the signal is valid. CS_0 to CS_2 are for indicating the first stage 22b and the second stage 23b of the normal process apparatus 20b. Each of CS_0 to CS_2 indicates either the first stage 22b or the second stage 23b by 0 or 1 of the bit. TR_REQ is for indicating whether to perform transferring or not. When being 1, the bit of TR_REQ indicates to perform the transferring. BUSY is for indicating whether the transferring is being performed or not. When being 1, the bit of BUSY indicates that the transferring is being performed. COMPLETE is for indicating whether the transferring has been completed or not. When being 1, the bit of COMPLETE indicates that the transferring has been completed.

In regard to the signal outputted from the normal process apparatus 20b, L_REQ is for indicating whether a request for loading of the cassette is made or not. When being 1, the bit of L_REQ indicates that the request for loading of the cassette is made. U_REQ indicates whether a request for unloading of the cassette is made or not. When being 1, the bit of U_REQ indicates that the request for unloading of the cassette is made. READY is for indicating whether to permit the transferring or not. When being 1, the bit of READY indicates that the transferring is permitted.

The optical I/O communication between the inter-process carrier 30a and the station 10 and the optical I/O communication between the inter-process carrier 30b and the station 10 are performed generally in the similar manner to the optical I/O communication described above. The station 10 outputs the same signal as the signal outputted from the normal process apparatus 20b. In the optical I/O communication between the in-process carrier 30a and the station 10 and the optical I/O communication between the inter-process carrier 30b and the station 10, the bits CS_0 to CS_2 indicate either the first stage 16 or the second stage 17 of the station 10.

Next, the optical I/O communication between the connected process apparatus 20a and the station 10 will be described.

Figure 3C:
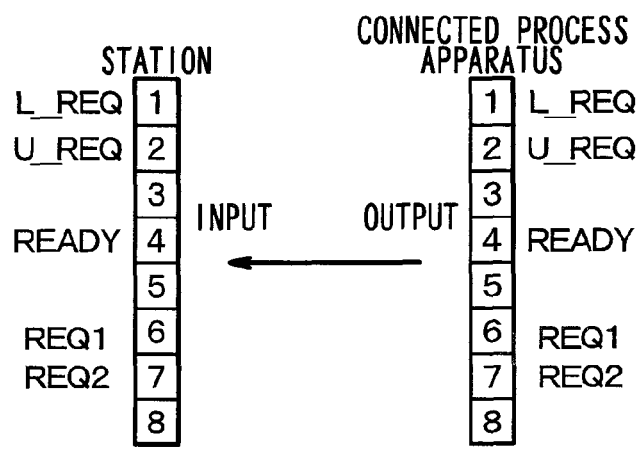
FIG. 3C is a schematic diagram illustrating a signal provided from a connected process apparatus to a station according to the first embodiment.

The optical I/O communication between the station 10 and the connected process apparatus 20a is also performed by the 8-bit input/output. As shown in FIG. 3C, the signal provided from the connected process apparatus 20a to the station 10 includes REQ1 and REQ2. REQ1 and REQ2 are for indicating whether there is the cassette to be unloaded from the connected process apparatus 20a. In the present embodiment, the connected process apparatus 20a has the first stage 22a and the second stage 23a. REQ1 indicates whether there is the cassette to be unloaded from the first stage 22a. When being 1, the bit of REQ1 indicates that there is the cassette to be unloaded from the first stage 22a. REQ2 indicates whether there is the cassette to be unloaded from the second stage 22b. When being 1, the bit of REQ2 indicates that there is the cassette to be unloaded from the second stage 22b.

The signal provided from the station 10 to the connected process apparatus 20a is similar to the signal shown in FIG. 3A. CS_0 to CS_2 indicate the first stage 22b and the second stage 23b of the connected process apparatus 20a.

Next, an operation of the transfer system having the structure described hereinabove will be described. Note that the transferring between the in-process carrier 30a and the normal process apparatus 20b and the station 10, and the transferring between the inter-process carrier 30b and the station 10 are performed in a similar manner to a general transfer system (SEMI standard). Therefore, descriptions of these transferring will be omitted, and loading and unloading of the cassette between the station 10 and the connected process apparatus 20a will be hereinafter described with reference to FIG. 4 and FIG. 5.

Figure 4:
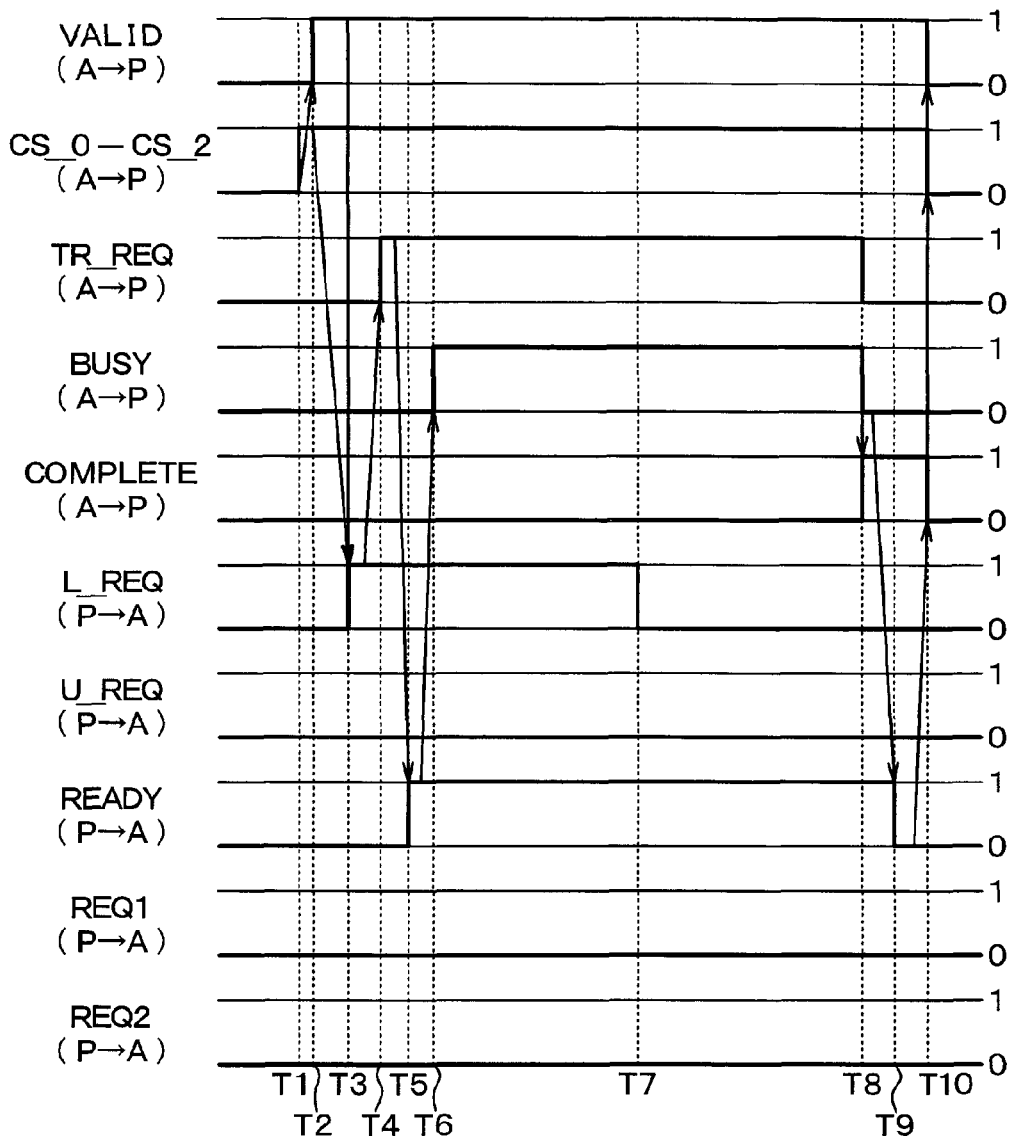
FIG. 4 is a time chart of signals when a cassette is loaded to the connected process apparatus from the station according to the first embodiment.
Figure 5:
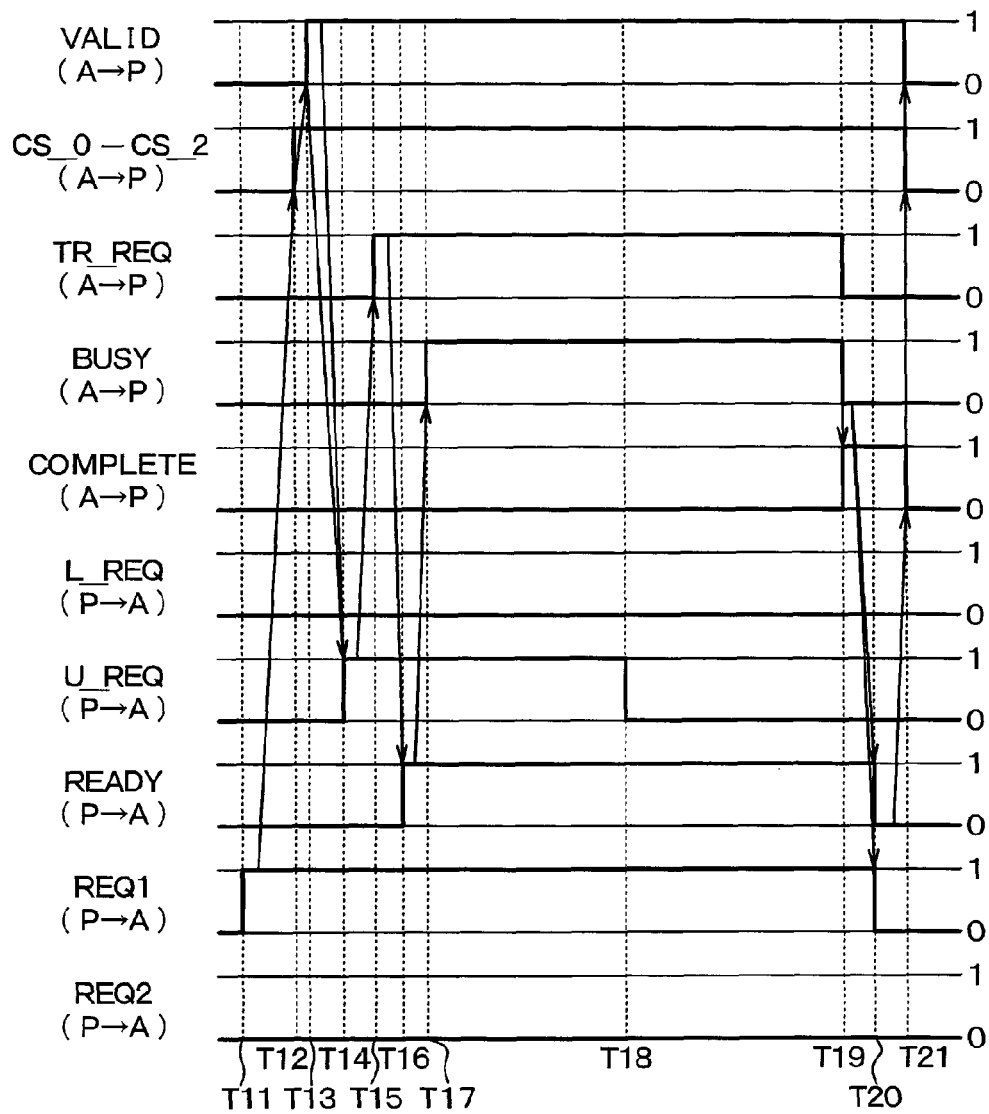
FIG. 5 is a time chart of signals when the cassette is unloaded from the connected process apparatus to the station according to the first embodiment.

In FIG. 4 and FIG. 5, "A→P" indicates the signal provided from the station (active) 10 to the connected process apparatus (passive) 20a, and "P A" indicates the signal provided from the connected process apparatus 20a to the station 10. The signal is actually outputted from and inputted to the station control section 70 and the connected process apparatus control section 80a. That is, the signal is actually transmitted between the station control section 70 and the connected process apparatus control section 80a. However, it will be simply described as that the signal is outputted from and inputted to the station 10 and the connected process apparatus 20a for the sake of easing the understanding.

First, an operation to load the cassette to the connected process apparatus 20a from the station 10 will be described.

As shown in FIG. 4, when the transfer control section 50 outputs the third transfer signal U3 to the station control section 70 at a time point T1, the station 10 outputs to the connected process apparatus 20a the signal in which the bits of CS_0 to CS_2, which indicate the loading destination of the connected process apparatus 20a, such as the first stage 22a or the second stage 23b, are appropriately 1. At a time point T2, the station 10 outputs to the connected process apparatus 20a the signal in which the bit of VALID, which indicates the validity of the signal, is also 1.

At a time point T3, the connected process apparatus 20a outputs to the station 10 the signal in which the bit of L_REQ, which indicates the request for loading the cassette, is 1. At a time point T4, the station 10 outputs to the connected process apparatus 20a the signal in which the bit of TR_REQ, which indicates the transferring, is 1.

At a time point T5, the connected process apparatus 20a outputs to the station 10 the signal in which the bit of READY, which indicates the permission of the transferring, is 1. At a time point T6, the station 10 outputs to the connected process apparatus 20a the signal in which the bit of BUSY, which indicates to perform the operation, is 1. Thus, the loading of the cassette to the connected process apparatus 20a from the station 10 is started.

At a time point T7, when the cassette is loaded to the connected process apparatus 20a, the connected process apparatus 20a outputs to the station 10 the signal in which the bit of L_REQ, which indicates the request for the loading of the cassette, is 0. At a time point T8, the station 10 outputs to the connected process apparatus 20a the signal in which the bit of BUSY, which indicates to perform the operation, is 0 and the bit of COMPLETE, which indicates the completion of the transferring, is 1.

At a time point T9, as the transferring of the cassette has been completed, the connected process apparatus 20a outputs to the station 10 the signal in which the bit of READY, which indicates the permission of the transferring, is 0. At a time point T10, the station 10 outputs to the connected process apparatus 20a the signal in which the bits of CS_0 to CS_2, which indicate the loading destination, are 0 and the bit of VALID, which indicates the validity of the signal, is 0.

Next, an operation of unloading the cassette from the connected process apparatus 20a to the station 10 will be described.

As shown in FIG. 5, when the host controller 40 outputs the second signal S2 to the connected process apparatus control section 80a at a time point T11, the connected process apparatus 20a outputs to the station 10 the signal in which the bit of REQ1, REQ2, which appropriately indicates the first stage 22a or the second stage 23a of the connected process apparatus 20a on which the cassette is placed, is 1. In this case, assuming that the first stage 22a has the cassette to be unloaded, the signal in which the bit of REQ1, which indicates that the first stage 22a has the cassette to be unloaded, is 1 is outputted.

At a time point T12, the station 10 outputs to the connected process apparatus 20a the signal in which the bits of CS_0 to CS_2, which appropriately indicate the first stage 22a or the second stage 23a as the unloading source from which the cassette is unloaded, is 1. That is, when the signal in which the bit of REQ1, REQ2, which appropriately indicates the first state 22a or the second stage 23a on which the cassette is placed, is 1 is outputted from the connected process apparatus 20a to the station 10, the operation of unloading the cassette from the connected process apparatus 20a to the station 10 is started. In other words, the operation of unloading the cassette from the connected process apparatus 20a to the station 10 is triggered when the bit of REQ1, REQ2, which indicates the first or second stage 22a, 23a, appropriately changes to 1. At a time point T13, the station 10 outputs to the connected process apparatus 20a the signal in which the bit of VALID, which indicates the validity of the signal, is 1.

At a time point T14, the connected process apparatus 20a outputs to the station 10 the signal in which the bit of U_REQ, which indicates the request for unloading the cassette, is 1. At a time point T15, the station 10 outputs to the connected process apparatus 20a the signal in which the bit of TR_REQ, which indicate to perform the transferring, is 1.

At a time point T16, the connected process apparatus 20a outputs to the station 10 the signal in which the bit of READY, which indicates the permission of the transferring, is 1. At a time point T17, the station 10 outputs to the connected process apparatus 20a the signal in which the bit of BUSY, which indicates to perform the operation, is 1. Thus, the cassette is unloaded from the connected process apparatus 20a to the station 10.

At a time point T18, when the cassette is unloaded from the connected process apparatus 20a, the connected process apparatus 20a outputs to the station 10 the signal in which the bit of U_REQ, which indicates the request for the unloading of the cassette, is 0. At a time point T19, the station 10 outputs to the connected process apparatus 20a the signal in which the bit of BUSY, which indicates to perform the operation, is 0 and the bit of COMPLETE, which indicates the completion of the transferring, is 1.

At a time point T20, as the transferring of the cassette has been completed, the connected process apparatus 20a outputs to the station 10 the signal in which the bit of READY, which indicates the permission of the transferring, is 0 and the bits of REQ1, REQ2, which indicate the first and second stages 22a, 23a on which the cassette are placed, are 0. At a time point T21, the station 10 outputs to the connected process apparatus 20a the signal in which the bits of CS_0 to CS_2, which indicate the first and second stages 22a, 23a as the unloading source, are 0 and the bit of VALID, which indicates the validity of the signal, is 0 is outputted. The transfer system of the present embodiment is operated in the manner described hereinabove. In FIG. 4, when the cassette is loaded to the connected process apparatus 20a from the station 10, the bits of REQ1, REQ2 indicating the first stage 22a and the second stage 23a on which the cassette is placed are 0. In an actual transfer system, there may be a case where the bits of REQ1, REQ2 are 1 while the cassette is being loaded to the connected process apparatus 20a from the station 10. In this case, the unloading is started after the loading which is being performed is completed.

In the present embodiment as described hereinabove, the connected process apparatus 20a is connected to the station 10. The transferring of the cassette between the station 10 and the connected process apparatus 20a is performed using the transfer robot 12. Since the carrier is not necessary to transfer the cassette between the station 10 and the connected process apparatus 20a, the decrease of the rate of operation is restricted.

As the connected process apparatus 20a, the process apparatus that has the shortest processing period among the process apparatuses provided in the same area is connected to the station 10. Therefore, the decrease of the operation rate is further restricted.

The station control section 70 and the connected process apparatus 80a perform the optical I/O communication, similarly to the communication between the in-process carrier control section 60a, the normal process apparatus control section 80b and the station control section 70. Therefore, the normal process apparatus, which is generally used, can be employed as the connected process apparatus 20a by simply changing.

The signal outputted from the connected process apparatus control section 80a to the station 10 includes the bits of REQ1, REQ2 indicating the first and second stages 22a, 23a on which the cassette is placed. When the bits of REQ1, REQ2 indicating the first and second stages 22a, 23a change to 1, the operation of unloading the cassette from the connected process apparatus 20a to the station 10 is started. Therefore, the communication of the station control unit 70, which is generally used, can be employed, and the connected process apparatus 20a can be provided without largely changing the entirety of the transfer system.

Other Embodiments

The present disclosure is not limited to the embodiment described hereinabove, but may be implemented in various other ways.

Figure 6:
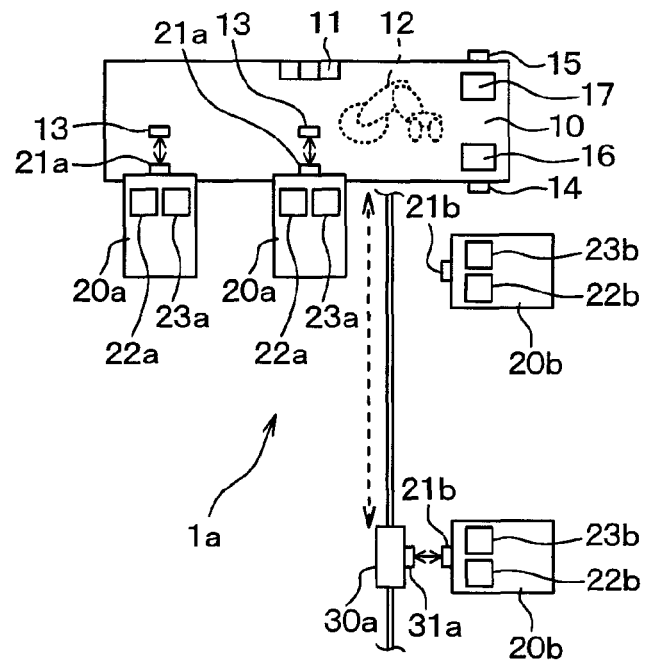
FIG. 6 is a schematic diagram illustrating a layout of a station, connected process apparatuses and normal process apparatuses of a first area according to another embodiment of the present disclosure.
Figure 7:
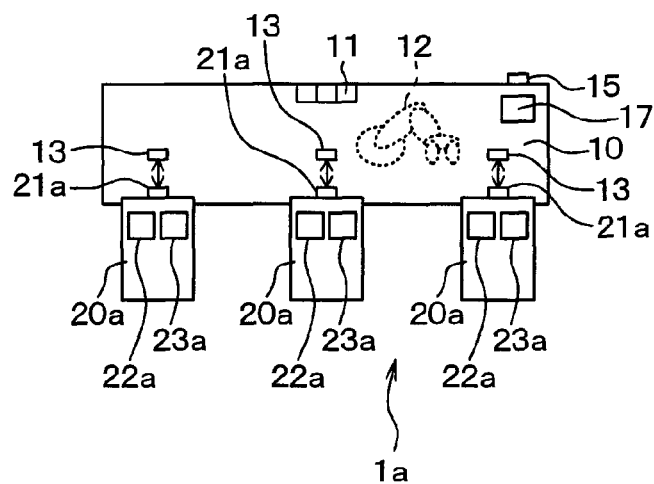
FIG. 7 is a schematic diagram illustrating a layout of a station and connected process apparatuses of a first area according to further another embodiment of the present disclosure.

For example, a plurality of connected process apparatuses 20a may be provided for the station 10 in the first area 1a, as shown in FIG. 6. As another example, all of the process apparatuses may be connected to the station 10 in the first area 1a, as shown in FIG. 7. In other words, the normal process apparatuses 20b and the in-process carriers 30a may not be provided in the first area 1a. Although not illustrated, these examples may be true in the second and the third areas 1b and 1c.

In the first embodiment, one station 10 is provided in each of the first to third areas 1a to 1c. As another example, the number of the stations 10 provided in each area may be suitably changed.

In the first embodiment, the inter-process carrier may be an overhead shuttle (OHS).

In the first embodiment, the in-process carrier control section 60a and the inter-process carrier control section 60b may be constructed by the same control section. The connected process apparatus control section 80a and the normal process apparatus control section 80b may be constructed by the same control section.

While only the selected exemplary embodiment and examples have been chosen to illustrate the present disclosure, it will be apparent to those skilled in the art from this disclosure that various changes and modifications can be made therein without departing from the scope of the disclosure as defined in the appended claims. Furthermore, the foregoing description of the exemplary embodiment and examples according to the present disclosure is provided for illustration only, and not for the purpose of limiting the disclosure as defined by the appended claims and their equivalents.

What is claimed is:

1. A transfer system comprising:
a plurality of process apparatuses, each of the process apparatuses conducts a predetermined process to a processing object to be processed;
a process apparatus control unit that controls the process apparatuses;
a station that receives the processing object from an inter-process carrier and stores the processing object;
a transfer device provided in the station, the transfer device transfers the processing object;
a station control unit that controls the transfer device, wherein
at least one of the plurality of process apparatuses is directly connected to the station as a connected process apparatus so that loading of the processing object to the connected process apparatus from the station and unloading of the processing object from the connected process apparatus to the station are directly performed by the transfer device provided in the station; and
an in-process carrier that loads the processing object, carries the processing object between the station and the process apparatuses other than the connected process apparatus, and unloads the processing object,
wherein the station control unit controls the transfer device through a communication with the process apparatus control unit to load the processing object to the connected process apparatus from the station and to unload the processing object from the connected process apparatus to the station, and
wherein the station control unit controls the transfer device to begin unloading of the processing object from the connected process apparatus to the station after receiving a signal indicative of a presence of the processing object to be unloaded from the process apparatus control unit.

2. The transfer system according to claim 1, wherein the connected process apparatus is one of the plurality of process apparatuses without having a longest process period among the plurality of process apparatuses.

3. The transfer system according to claim 1, wherein the connected process apparatus is one of the plurality of process apparatuses having a shortest process period among the plurality of process apparatuses.

4. The transfer system according to claim 1, wherein the transfer device is a transfer robot fixed in the station.

5. The transfer system according to claim 1, wherein the process apparatus control unit includes a connected process apparatus control unit that controls the connected process apparatus, and a normal process apparatus control unit that controls the process apparatuses other than the connected process apparatus, and the station control unit controls the transfer device through communication with the connected process apparatus control unit.

* * * * *